United States Patent
Hsu

(10) Patent No.: US 8,080,457 B1
(45) Date of Patent: Dec. 20, 2011

(54) FABRICATION METHOD OF POWER SEMICONDUCTOR STRUCTURE WITH LOW GATE CHARGE

(75) Inventor: Hsiu-Wen Hsu, Hsinchu County (TW)

(73) Assignee: Great Power Semiconductor Corp., Taipei (TW)

( * ) Notice: Subject to any disclaimer, the term of this patent is extended or adjusted under 35 U.S.C. 154(b) by 0 days.

(21) Appl. No.: 12/917,498

(22) Filed: Nov. 2, 2010

(30) Foreign Application Priority Data

Jul. 23, 2010 (TW) ................ 99124226 A

(51) Int. Cl.
*H01L 21/336* (2006.01)
*H01L 21/8234* (2006.01)
*H01L 21/8242* (2006.01)
*H01L 21/20* (2006.01)

(52) U.S. Cl. ........ 438/259; 438/197; 438/243; 438/270; 438/589; 257/E21.382; 257/E21.384; 257/E21.396; 257/E21.419

(58) Field of Classification Search ........... 257/E21.384, 257/E21.396, E21.4
See application file for complete search history.

(56) References Cited

U.S. PATENT DOCUMENTS

| 6,251,730 | B1 * | 6/2001 | Luo ................................ 438/270 |
| 6,621,107 | B2 * | 9/2003 | Blanchard et al. ............ 257/155 |
| 7,923,776 | B2 * | 4/2011 | Yilmaz et al. ................. 257/332 |
| 7,994,001 | B1 * | 8/2011 | Hsu et al. ...................... 438/237 |

* cited by examiner

*Primary Examiner* — Mohsen Ahmadi
(74) *Attorney, Agent, or Firm* — Jianq Chyun IP Office

(57) ABSTRACT

A fabrication method of a trenched power semiconductor structure with low gate charge is provided. Firstly, a substrate is provided. Then, a gate trench is formed in the substrate. Afterward, a dielectric layer is formed on the inner surfaces of the gate trench. Then, a spacer is formed on the dielectric layer covering the sidewall of the gate trench. Thereafter, a plug structure is formed in the space at the bottom of the gate trench, which is defined by the spacer. Then, a portion of the spacer is removed with the dielectric structure and the plug structure as an etching mask. Thereafter, a portion of the dielectric layer is removed with the remained spacer as an etching mask to expose the inner surface of the upper portion of the gate trench. Afterward, with the remained spacer being kept, a gate dielectric layer is formed on the inner surface of the upper portion of the gate trench, and then a polysilicon gate is filled into the upper portion of the gate trench.

8 Claims, 5 Drawing Sheets

FABRICATION METHOD OF POWER SEMICONDUCTOR STRUCTURE WITH LOW GATE CHARGE

CROSS-REFERENCE TO RELATED APPLICATION

This application claims the priority benefit of Taiwan application serial no. 99124226, filed on Jul. 23, 2010. The entirety of the above-mentioned patent application is hereby incorporated by reference herein and made a part of this specification.

BACKGROUND OF THE INVENTION (1) Field of the Invention

The invention relates to a fabrication method of a trenched power semiconductor structure. More particularly, the invention relates to a fabrication method of a trenched power semiconductor structure with a low gate charge.

(2) Description of the Prior Art

Compared with the conventional planar power semiconductor structure, a conducting current flows along a direction parallel with the surface of the substrate. A trenched power semiconductor structure changes the position of the gate channel by setting the gate in the trench, such that the conducting current flows along a direction perpendicular to the substrate. Therefore, the trenched power semiconductor structure can be reduced the scale of components, and raised the integration of the components. Common power semiconductors include metal-oxide-semiconductor field-effect transistor (MOSFET), and insulated gate bipolar transistor (IGBT), etc.

The main power loss of the power semiconductor includes the conducting loss due to on-resistance, and the switching loss due to the gate charge. As the operating frequency being raised, the ratio of the switching loss is more increased. For the structure characteristic of the power semiconductor, it is useful to improve the switching rate and decrease the switching loss through decreasing the gate-drain capacitor Cgd.

Therefore, to search a fabrication method of power semiconductor structure for reducing gate-drain capacitor is an important issue in this technical field.

SUMMARY OF THE INVENTION

The main purpose of the present invention is to decrease gate-drain capacitor Cgd of a power semiconductor, so as to decrease the switching loss for high frequency application.

The present invention provides a fabrication method of a trenched power semiconductor structure with low gate charge. Firstly, a substrate is provided. The substrate has a drain zone which is defined therein. Then, a gate trench is formed in the substrate. Afterward, a dielectric layer is formed on the inner surfaces of the gate trench. Then, a spacer is formed on the dielectric layer covering the sidewall of the gate trench and defined a space at the bottom of the gate trench. Thereafter, a plug structure is formed in the space at the bottom of the gate trench. Then, a portion of the spacer is removed with the dielectric structure and the plug structure as an etching mask. Thereafter, a portion of the dielectric layer is removed with the remained spacer as an etching mask to expose the inner surface of the upper portion of the gate trench. Afterward, with the remained spacer being kept, a gate dielectric layer is formed on the inner surface of the upper portion of the gate trench, and then a polysilicon gate is filled into the upper portion of the gate trench. Wherein, the plug structure is used to increase the distance between the polysilicon gate and drain zone, so as to decrease the Cgd.

In an embodiment of the invention, the above plug structure is a dielectric structure.

In an embodiment of the invention, the above plug structure is a polysilicon structure.

In an embodiment of the invention, the above plug structure is stacked at least a first dielectric layer and a polysilicon layer.

Furthermore, in an embodiment providing the fabrication method, the plug structure is formed in the space at the bottom of the gate trench and can enlarge the distance between the polysilicon gate and drain zone, so as to decrease the Cgd of the trenched power semiconductor structure. Accordingly, the invention can efficiently decrease the switching loss.

It is to be understood that both the foregoing general description and the following detailed description are exemplary, and are intended to provide further explanation of the invention as claimed. In order to make the features and the advantages of the invention comprehensible, exemplary embodiments accompanied with figures are described in detail below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 1A:
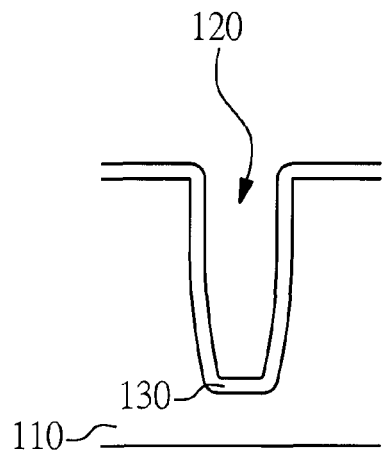
FIG. 1A to FIG. 1G show a fabrication method of a trenched power semiconductor structure with a low gate charge according to a first embodiment of the invention.

FIG. 1A to FIG. 1G show a fabrication method of a trenched power semiconductor structure with a low gate charge according to a first embodiment of the invention. Referring to FIG. 1A, a substrate 110 is provided. The substrate 110 has dopants of first conductive type which may be a drain zone of the power semiconductor structure. For the first embodiment of the invention, the substrate 110 may be composed of a base with heavy doping and an epitaxial layer with light doping on the base. Afterward, a gate trench 120 is formed in the substrate 110. Next, a dielectric layer 130 is formed on the inner surfaces of the gate trench 120. The dielectric layer 130 can be composed of silicon dioxide or silicon nitride.

Figure 1B:
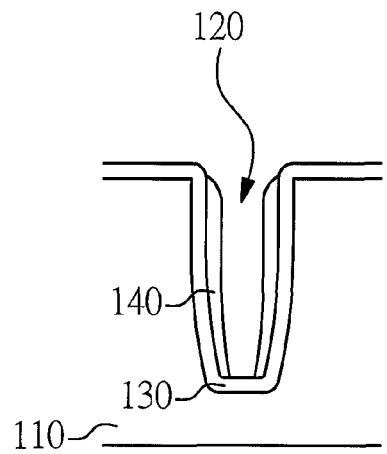

Following, a spacer 140 is formed on the dielectric layer 130 covering the sidewall of the gate trench 120 and defined a space at the bottom of the gate trench 120, so as to expose the dielectric layer 130 at the bottom of the gate trench 120, as shown in FIG. 1B. The composed materials of the spacer 140 are different from the above dielectric layer 130 to advantage the next process of the selective etching step.

Figure 1C:
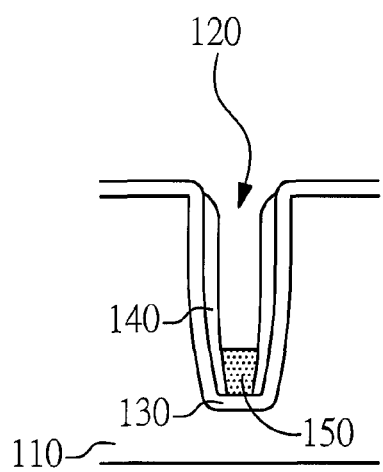

Referring to FIG. 1C, a plug structure 150 is formed in the space at the bottom of the gate trench 120, which is defined by the spacer 140. In the present embodiment, the plus structure 150 is a polysilicon structure. Then, a portion of the spacer 140 is removed with the dielectric layer 130 and the plug structure 150 as an etching mask. The etching step may adopt selective etching step, and combine with an etching back technology, such that the upper edge of a remained spacer 140' is below or above the upper edge of the plug structure 150.

Figure 1D:
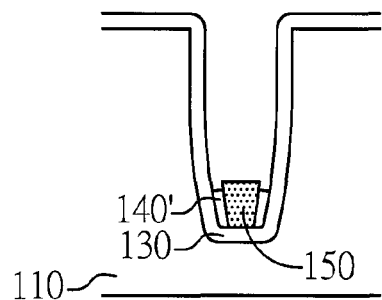
Figure 1E:
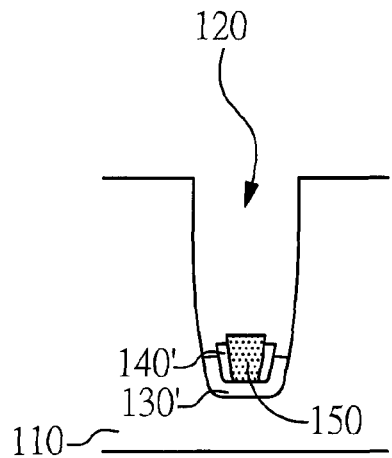

Next, Referring to FIG. 1E, a portion of the dielectric layer 130 is removed with the remained spacer 140' as an etching mask to expose the upper portion of the inner surface of the gate trench 120. Similar to the above etching step of the spacer 140, the etching step may also adopt a selective etching technique, and combine with the etching back technology, such that the upper edge of a remained dielectric layer 130' is below the upper edge of the spacer 140.

Figure 1F:
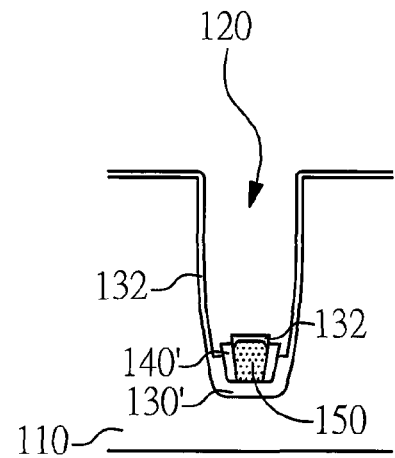
Figure 1G:
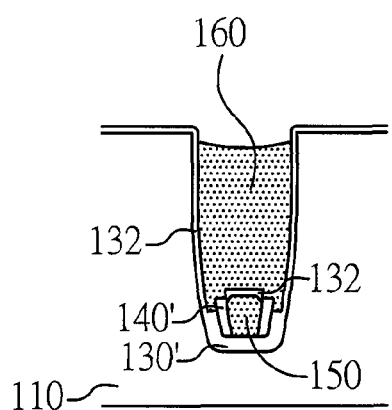

Afterward, referring to FIG. 1F, with the remained spacer 140' being kept, a gate dielectric layer 132 is formed on the inner surface of the upper portion of the gate trench 120. Due to the plug structure 150 of the embodiment being a polysilicon structure, the gate dielectric layer 132 is also formed on the exposed surface of the plug structure 150 at the same time. And then a polysilicon gate 160 is filled into the upper portion of the gate trench 120, so as to accomplish the fabrication of the gate structure, as shown in FIG. 1G.

In the present embodiment, it should be noted that, the plug structure 150, which is formed in the space at the bottom of the gate trench 120, conduces to increase the distance between the polysilicon gate 160 and the drain zone, so as to decrease the gate-drain capacitor Cgd of the trenched power semiconductor structure. For the first embodiment of the invention, the plug structure 150 which is composed of the polysilicon further be applied the voltage of the source thereto.

Beside from that, after the two etching steps of FIG. 1D and FIG. 1E, the upper edges of the plug structure 150, the remained spacer 140', and dielectric layer 130 is decreased gradually from the center toward the bilateral sides of the gate trench 120. In other words, the polysilicon gate 160 has a depth in the center of the gate trench 120 is less than that in the side of the gate trench 120. Thus, the fabrication method of the present embodiment may maintain an enough distance between the polysilicon gate 160 and drain zone. Because of the fabrication for the plug structure 150, it may also avoid the channel length, i.e. the length of the overlapped surface between the body and the polysilicon gate 160, is too short.

Figure 2A:
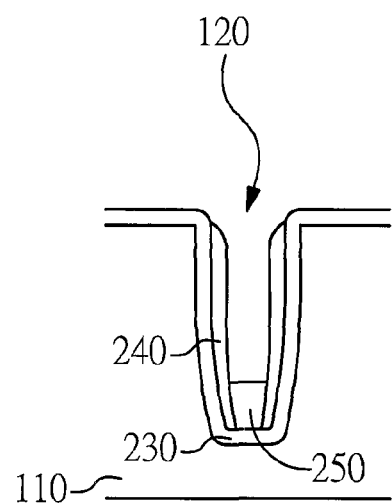
FIG. 2A to FIG. 2E show the fabrication method of the trenched power semiconductor structure with the low gate charge according to a second embodiment of the invention.

FIG. 2A to FIG. 2E show a fabrication method of the trenched power semiconductor structure with the low gate charge according to a second embodiment of the invention. Referring to FIG. 2A, compared with the first embodiment of the invention, the difference in the present embodiment lies in that, a plug structure 250 of the present embodiment is composed of dielectric structure. In the present embodiment, a dielectric layer 230 and a plug structure 250 is composed of silicon dioxide. A spacer 240 is composed of Silicon Nitride.

Figure 2B:
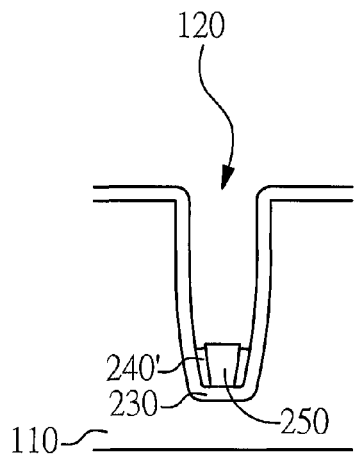
Figure 2C:
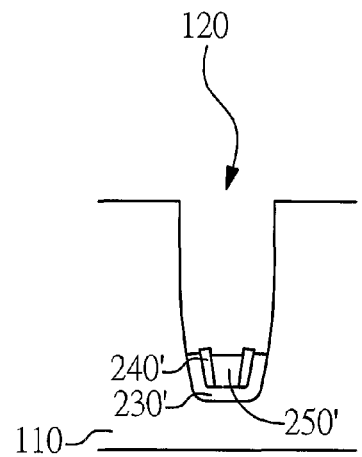
Figure 2D:
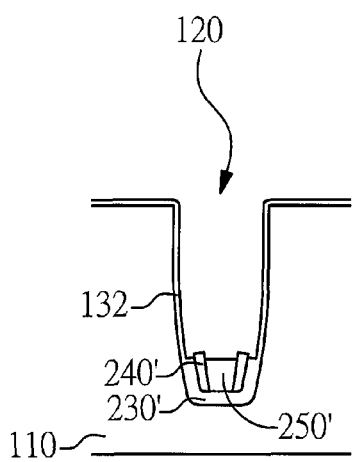
Figure 2E:
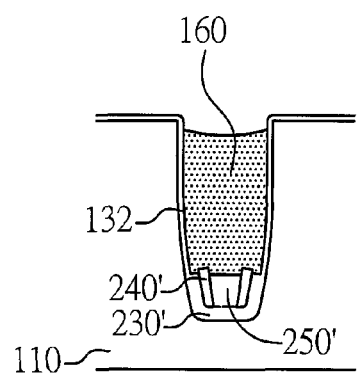

Referring to FIG. 2B, an exposed portion of the spacer 240 is removed with the dielectric layer 230 and the plug structure 250 as an etching mask, e.g.: by selective etching. Beside from that, the composed materials of the dielectric layer 230 and the plug structure 250 are the same. As shown in FIG. 2C, when the dielectric layer 230 is removed by etching, a portion of the plug structure 250 is also removed at the same time. Therefore, the upper edge of the remained plug structure 250' is below the upper edge of a remained spacer 240'. As shown in FIG. 2D and FIG. 2E, the following steps of the present embodiment are similar to that of the first embodiment, and it will not be described again herein.

Figure 3A:
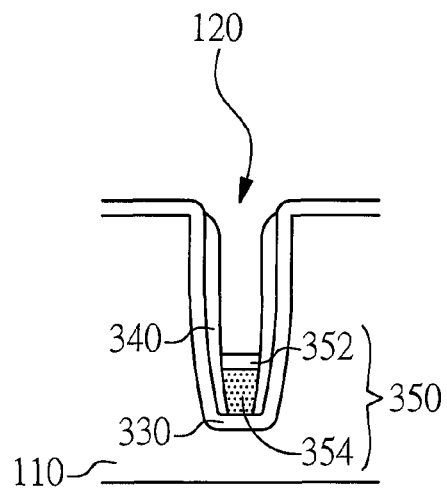
FIG. 3A to FIG. 3E show the fabrication method of the trenched power semiconductor structure with the low gate charge according to a third embodiment of the invention.

FIG. 3A to FIG. 3E show a fabrication method of the trenched power semiconductor structure with the low gate charge according to a third embodiment of the invention. Referring to FIG. 3A, compared with the first embodiment of the invention, the difference in the present embodiment lies in that, a plus structure 350 of the present embodiment is composed of a first dielectric layer 352 and a polysilicon layer 354. Wherein, the first dielectric layer 352 is covered on the polysilicon 354, but the invention is not limited thereto. For example, the plug structure 350 may be also composed of two polysilicon layer and clipped one of the dielectric layers, or be arranged by any arrangement method.

Figure 3B:
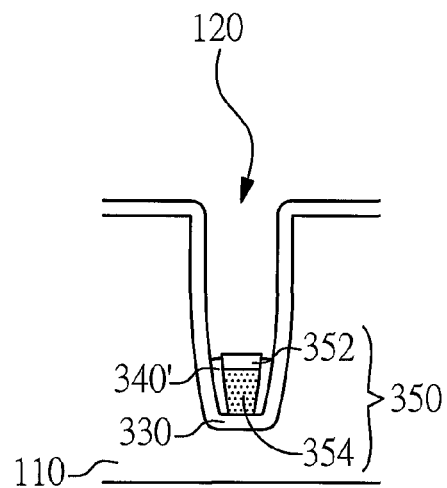
Figure 3C:
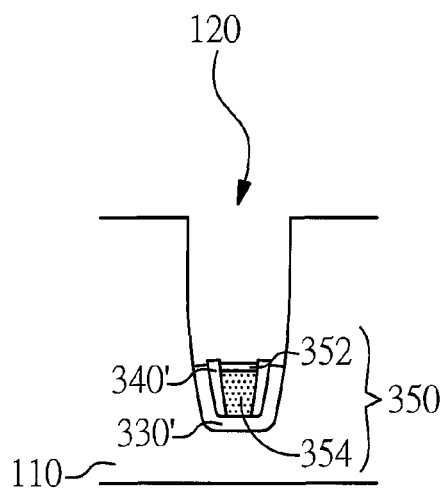
Figure 3D:
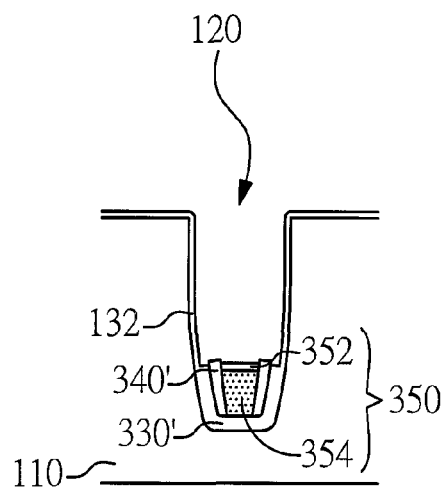
Figure 3E:
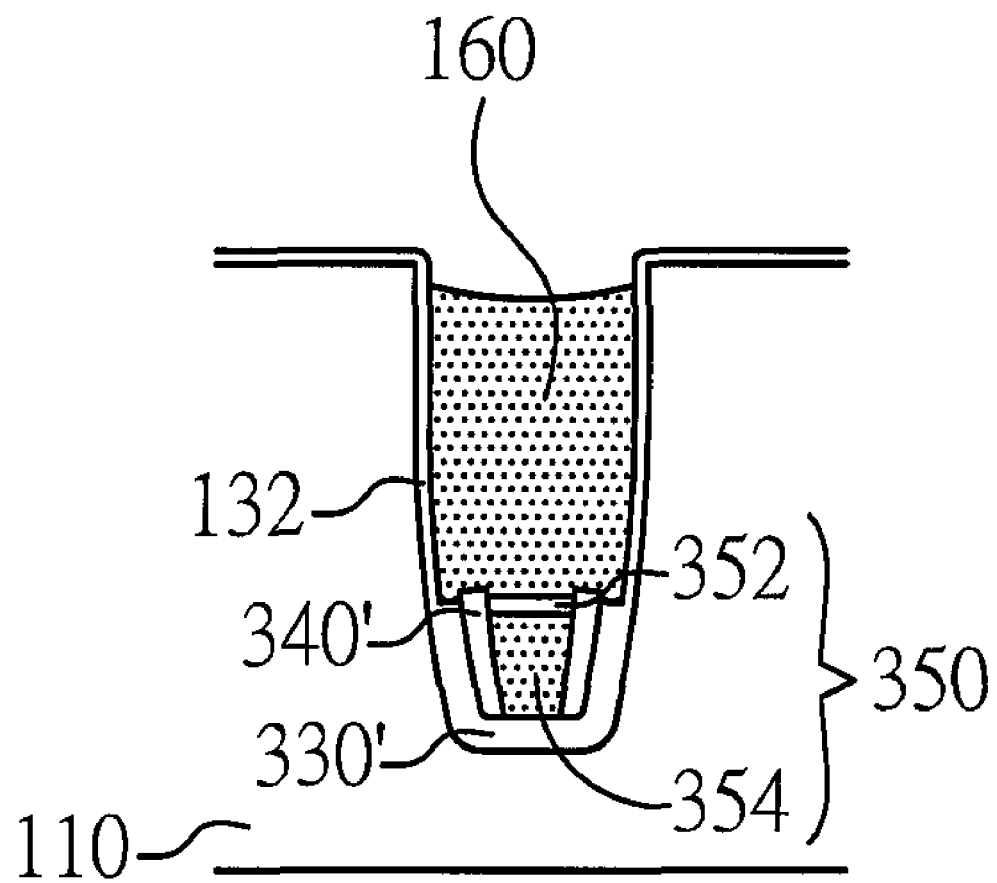

Referring to FIG. 3B, an exposed portion of the spacer 340 is removed with the dielectric layer 330 and the plug structure 350 as an etching mask. Following, the unwanted dielectric layer 330 is removed by etching. In the present embodiment, the composed materials of the dielectric layer 330 and the first dielectric layer 352 are the same. As shown in FIG. 3C, when the unwanted dielectric layer 330 is removed by etching, a portion of the first dielectric layer 352 is also removed at the same time. As shown in FIG. 3D and FIG. 3E, the following steps of the present embodiment are similar to that of the first embodiment, and it will not be described again herein.

As the above description, the invention completely complies with the patentability requirements: novelty, non-obviousness, and utility. It will be apparent to those skilled in the art that various modifications and variations can be made to the structure of the invention without departing from the scope or spirit of the invention. In view of the foregoing descriptions, it is intended that the invention covers modifications and variations of this invention if they fall within the scope of the following claims and their equivalents.

What is claimed is:

1. A fabrication method of a trenched power semiconductor structure, comprising the steps of:
   providing a substrate, which has a drain zone being defined therein;
   forming a gate trench in the substrate;
   forming a dielectric layer on inner surfaces of the gate trench;
   forming a spacer covering the dielectric layer on a sidewall of the gate trench;
   forming a polysilicon structure in a space at a bottom of the gate trench, and the space being defined by the spacer;
   removing an unwanted portion of the spacer with the dielectric layer and the polysilicon structure as a mask by using etching back technology;
   removing an unwanted portion of the dielectric layer with a remained portion of the spacer as an etching mask to expose the inner surface of an upper portion of the gate trench;
   wherein the remained portion of the spacer being left on the sidewall of the gate trench;
   forming a gate dielectric layer on the inner surface of the upper portion of the gate trench; and
   forming a polysilicon gate in the upper portion of the gate trench;
   wherein the polysilicon structure is used to increase a distance between the polysilicon gate and the drain zone;
   wherein an upper edge of the spacer is located above an upper edge of the polysilicon structure.

2. The fabrication method of the trenched power semiconductor structure according to claim 1, wherein the step of removing the unwanted portion of the spacer is carried out by using etching back technology, such that an upper edge of the spacer is located below an upper edge of the plug structure.

3. The fabrication method of the trenched power semiconductor structure according to claim 1, wherein, the step of removing the unwanted portion of the dielectric layer is carried out by using etching back technology, such that an upper edge of the dielectric is located below an upper edge of the spacer.

4. The fabrication method of the trenched power semiconductor structure according to claim 1, wherein the dielectric layer is composed of silicon dioxide.

5. The fabrication method of the trenched power semiconductor structure according to claim 1, wherein the spacer is composed of silicon nitride.

6. The fabrication method of the trenched power semiconductor structure according to claim 1, wherein the plug structure is a dielectric structure.

7. The fabrication method of the trenched power semiconductor structure according to claim 6, wherein the dielectric structure is composed of silicon oxide.

8. The fabrication method of the trenched power semiconductor structure according to claim 1, after the step of forming the polysilicon structure, further comprising the step of forming at least a first dielectric layer on the polysilicon structure.

* * * * *